(12) United States Patent
Linder

(10) Patent No.: US 7,470,934 B2
(45) Date of Patent: Dec. 30, 2008

(54) RADIATION-EMITTING OPTOELECTRONIC SEMICONDUCTOR CHIP WITH A DIFFUSION BARRIER

(75) Inventor: Norbert Linder, Lappersdorf (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 119 days.

(21) Appl. No.: 11/477,408

(22) Filed: Jun. 28, 2006

(65) Prior Publication Data
US 2007/0012927 A1 Jan. 18, 2007

(30) Foreign Application Priority Data
Jun. 28, 2005 (DE) ........................ 10 2005 030 152
Aug. 5, 2005 (DE) ........................ 10 2005 037 022

(51) Int. Cl.
*H01L 27/15* (2006.01)

(52) U.S. Cl. .................................. 257/85; 257/E33.016

(58) Field of Classification Search .................. 257/79, 257/14, 86, 85
See application file for complete search history.

(56) References Cited

U.S. PATENT DOCUMENTS

| | | | |
|---|---|---|---|
| 5,345,463 A | 9/1994 | Mannoh et al. | |
| 5,442,204 A | 8/1995 | Mensz | |
| 6,201,823 B1 * | 3/2001 | Kimura et al. | 372/46.01 |
| 6,233,266 B1 | 5/2001 | Kawasumi | |
| 6,437,372 B1 * | 8/2002 | Geva et al. | 257/94 |
| 7,042,013 B2 | 5/2006 | Linder et al. | |
| 7,193,246 B1 * | 3/2007 | Tanizawa et al. | 257/94 |
| 2002/0090167 A1 | 7/2002 | Geva et al. | |

(Continued)

FOREIGN PATENT DOCUMENTS

DE 103 06 311 A1 3/2004

(Continued)

OTHER PUBLICATIONS

Grillot, P.N. et al., "Acceptor diffusion and segregation in $(Al_xGa_{1-x})_{0.5}In_{0.5}P$ heterostructures", American Institute of Physics, Journal of Applied Physics, vol. 91, No. 8, pp. 4891 to 4899 (2002).

(Continued)

*Primary Examiner*—Wai-Sing Louie
*Assistant Examiner*—Bilkis Jahan
(74) *Attorney, Agent, or Firm*—Cohen Pontani Lieberman & Pavane LLP

(57) ABSTRACT

In a radiation-emitting optoelectronic semiconductor chip comprising an active layer (3) at least one p-doped layer (9) and a layer sequence (8) comprising a plurality of undoped layers (4, 5, 6, 7), which is arranged between the active layer (3) and the p-doped layer (9) and contains at least a first undoped layer (5) and a second undoped layer (6), the second undoped layer adjoining the first undoped layer (5) and succeeding the first undoped layer (5) as seen from the active layer (3), the first undoped layer (5) and the second undoped layer (6) in each case contain aluminum, the aluminum proportion being greater in the first undoped layer (5) than in the second undoped layer (6). The layer sequence (8) advantageously acts as a diffusion barrier for the dopant of the p-doped layer.

21 Claims, 2 Drawing Sheets

U.S. PATENT DOCUMENTS

2005/0056824 A1 * 3/2005 Bergmann et al. ............ 257/14

FOREIGN PATENT DOCUMENTS

| EP | 0458409 A1 * | 11/1991 |
| --- | --- | --- |
| EP | 0 762 516 A1 | 8/1996 |
| JP | 10-209573 | 8/1998 |
| JP | 11-68150 | 3/1999 |
| JP | 2003-243698 | 8/2003 |
| JP | 2004-356600 | 12/2004 |
| WO | WO 97/00546 * | 1/1997 |

OTHER PUBLICATIONS

Hirayama, H. "Applied Physics Reviews—Focused Review: Quaternary In AlGaN-based high-efficiency ultraviolet light-emitting diodes", American Institute of Physics, Journal of Applied Physics, vol. 97, No. 9, pp. 091101-1 to 091101-19 (2005).

Pursiainen, O. et al. "Identification of aging mechanisms in the optical and electrical characteristics of light-emitting diodes", Applied Physics Letters, vol. 79, No. 18, pp. 2895 to 2897 (2001).

Search Report dated Aug. 5, 2008, issued for the counterpart European Patent Application No. EP 06 01 1526.

* cited by examiner

RADIATION-EMITTING OPTOELECTRONIC SEMICONDUCTOR CHIP WITH A DIFFUSION BARRIER

RELATED APPLICATIONS

This patent application claims the priority of German patent applications 10 2005 030 152.5 and 10 2005 037 022.5, the disclosure content of which is hereby incorporated by reference.

FIELD OF THE INVENTION

The invention relates to a radiation-emitting optoelectronic semiconductor chip.

BACKGROUND OF THE INVENTION

During the growth of p-doped semiconductor layers, an undesirable diffusion of the dopant, for example Mg or Zn, into semiconductor layers situated at a deeper level often occurs. Such diffusion of the dopant has been observed, for example in the case of InAlGaP layers which have been fabricated epitaxially in particular by means of MOVPE.

Particularly in the case of optoelectronic components, for example LEDs or semiconductor lasers, diffusion of the p-type dopant in the semiconductor chip is disadvantageous since it is known, for example, that the presence of Mg or Zn in the active layer of optoelectronic components may lead to nonradiative processes which reduce the light generating efficiency. Furthermore, an increased concentration of one of these dopants in the active layer of an optoelectronic component may bring about an accelerated ageing of the radiation-emitting component.

In order to reduce diffusion of the p-type dopant from the p-doped layer into the active layer, generally one or a plurality of undoped layers are inserted between the active layer and the p-doped layer. However, undoped layers of this type, with increasing thickness, have a disadvantageous effect on the optical and electronic properties of the semiconductor chip.

Furthermore, U.S. Pat. Nos. 6,233,266 and 7,042,013 disclose inserting a strained superlattice between a p-doped layer and an active layer as a diffusion barrier. The document JP 11068150 A furthermore proposes inserting a layer with lattice defects between the p-doped layer and the active layer as a diffusion barrier for the p-type dopant.

SUMMARY OF THE INVENTION

One object of the present invention is to provide a radiation-emitting optoelectronic semiconductor chip with an improved diffusion barrier for efficiently reducing the diffusion of a p-type dopant into the active layer.

This and other objects are attained in accordance with one aspect of the present invention directed to a radiation-emitting optoelectronic semiconductor chip according to the invention comprising an active layer, at least one p-doped layer and a layer sequence consisting of a plurality of undoped layers, which is arranged between the active layer and the p-doped layer and contains at least a first undoped layer and a second undoped layer, the second undoped layer adjoining the first undoped layer and succeeding the first undoped layer as seen from the active layer, the first undoped layer and the second undoped layer contain aluminum, the first undoped layer having an aluminum proportion $y1$ and the second undoped layer having an aluminum proportion $y2$ and the aluminum proportion $y1$ in the first undoped layer being greater than the aluminum proportion $y2$ in the second undoped layer.

The invention is based on the insight, in particular, that the interface between the second undoped layer and the first undoped layer, which has a larger aluminum proportion than the second undoped layer, constitutes a diffusion barrier for a p-type dopant that diffuses from the p-doped layer in the direction toward the active layer. This effectively reduces the accumulation of a p-type dopant, for example Mg or Zn, in the active layer of the radiation-emitting optoelectronic semiconductor chip. This has the advantage, in particular, that charge carrier recombinations through nonradiative processes in the active layer are reduced and the light generating efficiency is thus increased.

In a first preferred embodiment of the invention, the first undoped layer has $In_{x1}Al_{y1}Ga_{1-x1-y1}P$ where $0 \leq x1 \leq 1$, $0 < y1 \leq 1$ and $x1+y1 \leq 1$, and the second undoped layer has $In_{x2}Al_{y2}Ga_{1-x2-y2}P$ where $0 \leq x2 \leq 1$, $0 < y2 \leq 1$ and $x2+y2 \leq 1$.

For the aluminum proportion $y1$ of the first undoped layer, $y1 \geq 0.2$ preferably holds true in the first embodiment of the invention. Furthermore, the first undoped layer advantageously has only a small gallium proportion, in which case, for the gallium proportion $1-x1-y1$ of the first undoped layer, $1-x1-y1 \leq 0.3$ advantageously holds true. Particularly preferably, the first undoped layer contains no gallium, that is to say that $1-x1-y1=0$ holds true. By way of example, the first undoped layer may have the composition $In_{0.5}Al_{0.5}P$. In this case, therefore, $x1=0.5$, $y1=0.5$ and $1-x1-y1=0$ hold true.

For the aluminum proportion $y2$ in the second undoped layer, $y2 \leq 0.4$ preferably holds true in the first embodiment of the invention. Furthermore, the second undoped layer preferably contains gallium, in which case, for the gallium proportion $1-x2-y2$, $1-x2-y2 \geq 0.1$ preferably holds true. By way of example, the second undoped layer may have the composition $In_{0.5}Al_{0.25}Ga_{0.25}P$. In this case, therefore, $x2=0.5$, $y2=0.25$ and $1-x2-y2=0.25$.

In a second preferred embodiment of the invention, the first undoped layer has $In_{x1}Al_{y1}Ga_{1-x1-y1}N$ where $0 \leq x1 \leq 1$, $0 < y1 \leq 1$ and $x1+y1 \leq 1$, and the second undoped layer has $In_{x2}Al_{y2}Ga_{1-x2-y2}N$ where $0 \leq x2 \leq 1$, $0 < y2 \leq 1$ and $x2+y2 \leq 1$.

For the aluminum proportion $y1$ of the first undoped layer, $y1 \geq 0.1$ preferably holds true in the second embodiment of the invention. Furthermore, the first undoped layer in this embodiment advantageously has a gallium proportion for which $1-x1-y1 \leq 0.9$ holds true. In particular, the first undoped layer may contain no gallium, that is to say that $1-x1-y1=0$ holds true. By way of example, the first undoped layer may have the composition $In_{0.5}Al_{0.5}N$. In this case, therefore $x1=0.5$, $y1=0.5$ and $1-x1-y1=0$ hold true.

For the aluminum proportion $y2$ in the second undoped layer, $y2 < 0.3$ preferably holds true in the second embodiment of the invention. Furthermore, the second undoped layer preferably contains gallium, in which case, for the gallium proportion $1-x2-y2$, $1-x2-y2 \geq 0.7$ preferably holds true.

In the two embodiments of the invention described above the first undoped layer and the second undoped layer preferably contain indium, so that $x1>0$ and $x2>0$ hold true. In particular, the first undoped layer and the second undoped layer may have the same indium proportion $x1=x2$.

Furthermore, the further semiconductor layers of the optoelectronic semiconductor chip, for example the active layer or the p-doped layer, may also be formed in each case from a nitride compound semiconductor, in particular $In_xAl_yGa_{1-x-y}N$ where $0 \leq x \leq 1$, $0 < y \leq 1$ and $x+y \leq 1$, or from a phosphide compound semiconductor, in particular $In_xAl_yGa_{1-x-y}P$ where $0 \leq x \leq 1$, $0 < y \leq 1$ and $x+y \leq 1$. In this case, the semiconductor material need not necessarily have a mathematically exact composition according to the above formulae. Rather, it may have additional constituents which essentially do not change the characteristic physical properties of the semiconductor material. For the sake of simplicity, however, the above formulae only comprise the essential constituents of the crystal lattice (Al, Ga, In, N or P), even though these may be replaced in part by small quantities of further substances.

The p-doped layer preferably contains Mg or Zn as dopant. As an alternatively, however, a different p-type dopant may also be provided.

It has proved to be advantageous that the concentration of the p-type dopant, on account of the interface between the second undoped layer and the first undoped layer acting as a diffusion barrier, already decreases significantly in that partial region of the first undoped layer which directly adjoins the interface. The average penetration depth of the p-type dopant into the first undoped layer having the higher aluminum portion is thus advantageously small. For this reason, even a comparatively thin first undoped layer constitutes an effective diffusion barrier for the p-type dopant. The thickness of the first undoped layer is preferably between 10 nm and 1 µm inclusive, particularly preferably between 20 nm and 200 nm inclusive.

In a further preferred embodiment of the invention, the total thickness of the layer sequence consisting of undoped layers which is contained between the p-doped layer and the active layer is between 50 nm and 1 µm inclusive.

This comparatively small total thickness of the undoped layer sequence has an advantageous effect on the optical and electronic properties of the radiation-emitting semiconductor chip. In particular, absorption losses and leakage currents are reduced by means of the comparatively small thickness of the undoped layer sequence arranged between the active layer and the p-doped layer.

The second undoped layer may be succeeded, as seen from the active layer, by at least one further undoped layer having a smaller aluminum proportion than the layer preceding it.

In particular, it may be provided that each of the undoped layers arranged between the active layer and the p-doped layer has a lower aluminum proportion than the layer preceding it. By way of example, the second undoped layer may be succeeded by a third undoped layer having a lower aluminum proportion than the second undoped layer. Furthermore, by way of example, the third undoped layer may be succeeded by a fourth undoped layer having a lower aluminum proportion than the third undoped layer. In the case of this embodiment of the invention, a p-type dopant that diffuses from the p-doped layer in the direction toward the active layer would have to traverse a plurality of interfaces between undoped layers, the aluminum proportion increasing at each of the interfaces traversed. The diffusion-inhibiting effect is thereby advantageously reinforced in comparison with an individual interface at which the aluminum proportion increases in the direction from the p-doped layer toward the active layer, since each of the interfaces acts as a diffusion barrier in this case.

In another embodiment, the second undoped layer may also be followed, as seen from the active layer, by a layer sequence having alternately a higher and a lower aluminum content. A p-type dopant diffusing from the p-doped layer in the direction toward the active layer would then have to traverse a plurality of interfaces between undoped layers, the aluminum content increasing at every second interface. In contrast to the embodiment described previously, it is thus possible to realize higher jumps in the aluminum content at the respective second interfaces.

The invention is advantageous in particular for radiation-emitting semiconductor chips having an epitaxial layer sequence deposited at a comparatively high temperature, since, in the case of epitaxial layer sequences of this type, there is the risk of the p-type dopant diffusing right into the active layer as early as during growth on account of the high temperatures. This risk exists particularly in the case of epitaxial layer sequences fabricated by means of MOVPE.

DETAILED DESCRIPTION OF THE DRAWINGS

Identical or identically acting elements are provided with the same reference symbols in the Figures. The elements illustrated are not to be regarded as true to scale, rather individual elements may be illustrated with an exaggerated size in order to afford a better understanding.

Figure 1:
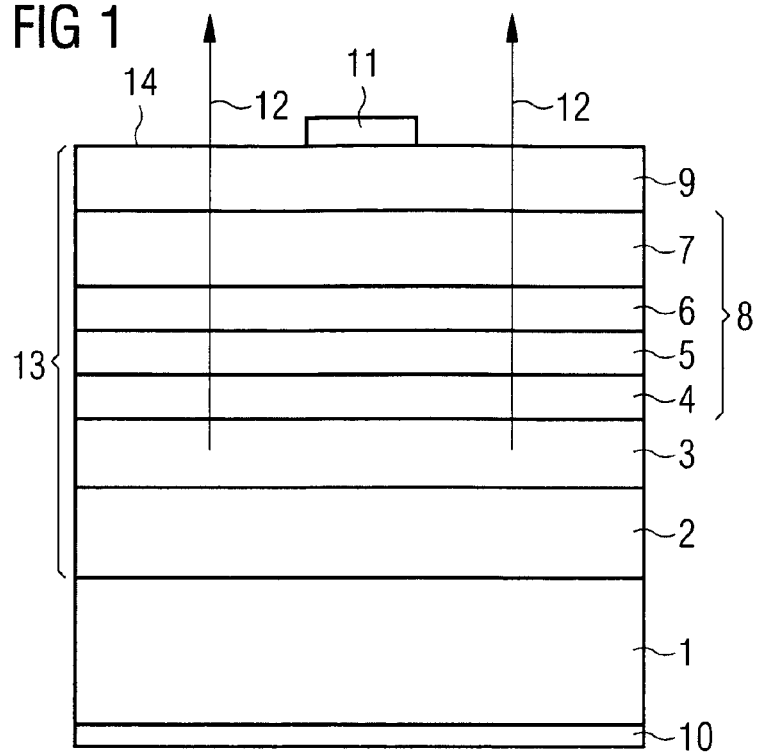
FIG. 1 shows a schematic illustration of a cross section through a radiation-emitting optoelectronic semiconductor chip in accordance with one exemplary embodiment of the invention.

The radiation-emitting optoelectronic semiconductor chip in accordance with one exemplary embodiment of the invention as illustrated schematically in cross section in FIG. 1 contains a semiconductor layer sequence 13 applied to a substrate 1. The semiconductor layer sequence 13 is applied to the substrate 1 preferably epitaxially, in particular by means of metal organic vapor phase epitaxy (MOVPE). The radiation-emitting semiconductor chip may be a light-emitting diode chip and also a laser diode chip.

The radiation-emitting semiconductor chip contains an active layer 3, from which electromagnetic radiation 12, for example radiation 12 from the ultraviolet, visible or infrared spectral range is emitted. The active layer 3 preferably contains $In_{x3}Al_{y3}Ga_{1-x3-y3}P$ or $In_{x3}Al_{y3}Ga_{1-x3-y3}N$ where $0 \leq x3 \leq 1$, $0 \leq y3 \leq 1$ and $x3+y3 \leq 1$. The active layer 3 may be formed for example as a heterostructure, double heterostructure or as a quantum well structure. In this case, the designation quantum well structure encompasses any structure in which charge carriers experience a quantization of their energy states as a result of confinement. In particular, the designation quantum well structure comprises no indication about the dimensionality of the quantization. It thus encompasses inter alia, quantum wells, quantum wires and quantum dots and any combination of these structures.

By way of example, two electrical contacts 10, 11 are provided for impressing current into the active layer 3, for example a first electrical contact 11 at a radiation exit area 14 of the semiconductor chip and a second electrical contact 10 at a side of the substrate 1 that is remote from the semiconductor layer sequence 13.

The semiconductor layer sequence 13 contains at least one p-doped layer 9 arranged for example between the first electrical contact 11 and the active layer 3. The p-doped layer 9 is preferably doped with Mg and/or Zn.

A layer sequence 8 consisting of a plurality of undoped layers 4, 5, 6, 7 is contained between the active layer 3 and the p-doped layer 9.

In one embodiment of the invention, the undoped layer sequence 8 contains a first undoped layer 5 made of $In_{x1}Al_{y1}Ga_{1-x1-y1}P$ where $0 \leq x1 \leq 1$, $0 < y1 \leq 1$ and $x1+y1 \leq 1$, and an adjoining second undoped layer 6 made of $In_{x2}Al_{y2}Ga_{1-x2-y2}P$ with $0 \leq x2 \leq 1$, $0 < y2 \leq 1$ and $x2+y2 \leq 1$. The aluminum proportion y1 of the first undoped layer 5 is preferably $y1 \geq 0.2$. For the aluminum proportion y2 of the second undoped layer 6, $y2 \leq 0.4$ preferably holds true.

In another embodiment, the undoped layer sequence 8 contains a first undoped layer 5 made of $In_{x1}Al_{y1}Ga_{1-x1-y1}N$ with $0 \leq x1 \leq 1$, $0 < y1 \leq 1$ and $x1+y1 \leq 1$, and an adjoining second undoped layer 6 made of $In_{x2}Al_{y2}Ga_{1-x2-y2}N$ with $0 \leq x2 \leq 1$, $0 < y2 \leq 1$ and $x2+y2 \leq 1$. In this case, the aluminum proportion y1 of the first undoped layer 5 is preferably $y1 \geq 0.1$, and, for the aluminum proportion y2 of the second undoped layer 6, $y2 < 0.3$ preferably holds true.

In both embodiments the aluminum proportion y1 of the first undoped layer 5 is greater than the aluminum proportion y2 of the second undoped layer 6, which succeeds the first undoped layer 5 as seen from the active layer 3.

In the direction from the p-doped layer 9 toward the active layer 3, the aluminum proportion thus increases at the interface from the second undoped layer 6 toward the first undoped layer 5. For a p-type dopant that diffuses from the p-doped layer 9 through the undoped layer 7 and the second undoped layer 6 in the direction toward the active layer 3, the interface between the second undoped layer 6 and the first undoped layer 5 constitutes a diffusion barrier. This means that the p-type dopant can advantageously penetrate only slightly into the first undoped layer 5 and, in particular, cannot traverse the latter or can traverse the latter at least only to the extent of a slight proportion. Diffusion of the p-type dopant into the active layer 3 is effectively reduced in this way.

The effect of the first undoped layer 5 may advantageously be improved further by virtue of the gallium proportion $1-x1-y1$ in the first undoped layer 5 being less than the gallium proportion $1-x2-y2$ in the second undoped layer 6. For the gallium proportion, $1-x1-y1 \leq 0.3$ preferably holds true in the case of a first undoped layer 5 made of $In_{x1}Al_{y1}Ga_{1-x1-y1}P$ and $1-x1-y1 \leq 0.9$ preferably holds true in the case of a first undoped layer 5 made of $In_{x1}Al_{y1}Ga_{1-x1-y1}N$. Particularly preferably, the first undoped layer 5 is even free of gallium, so that $1-x1-y1=0$ holds true.

The second undoped layer 6 advantageously has a larger gallium proportion than the first undoped layer 5. For the gallium proportion $1-x2-y2$, $1-x2-y2 \geq 0.1$ preferably holds true in the case of a second undoped layer 6 made of $In_{x2}Al_{y2}Ga_{1-x2-y2}P$ and $1-x2-y2 \geq 0.7$ preferably holds true in the case of a second undoped layer 6 made of $In_{x2}Al_{y2}Ga_{1-x2-y2}N$.

In addition to the first undoped layer 5 and the second undoped layer 6, the layer sequence 8 may contain further undoped layers, for example an undoped layer 4 arranged between the active layer 3 and the first undoped layer 5, and a further undoped layer 7 arranged between the second undoped layer 6 and the p-doped layer 9. The undoped layer 7 adjoining the p-doped layer 9 preferably has a larger aluminum proportion than the second undoped layer 6. The undoped layer 4 may, by way of example, have the same aluminum proportion as the second undoped layer 6.

The effect of the first undoped layer 5 as a diffusion barrier occurs even with a comparatively small thickness. The thickness of the first undoped layer 5 is preferably between 10 nm and 1000 nm inclusive.

In particular, the total thickness of the layer sequence 8 consisting of undoped layers 4, 5, 6, 7 that is arranged between the active layer 3 and the p-doped layer 9 may also be comparatively small on account of the effect of the first undoped layer 5 as a diffusion barrier. The total thickness of the layer sequence 8 is preferably between 50 nm and 1 μm inclusive. The comparatively small total thickness of the undoped layer sequence 8 has a positive effect on the efficiency of the optoelectronic semiconductor chip, since leakage currents and absorption losses are reduced in this way.

Furthermore, the semiconductor layer sequence 13 preferably contains at least one n-conducting layer 2 arranged for example between the substrate 1 and the active layer 3. Instead of the n-conducting layer 2 between the substrate 1 and the active layer 3 as illustrated in FIG. 1, a layer sequence comprising a plurality of layers, which may for example also contain undoped layers, may also be provided between the substrate and the active layer 3.

Figure 2:
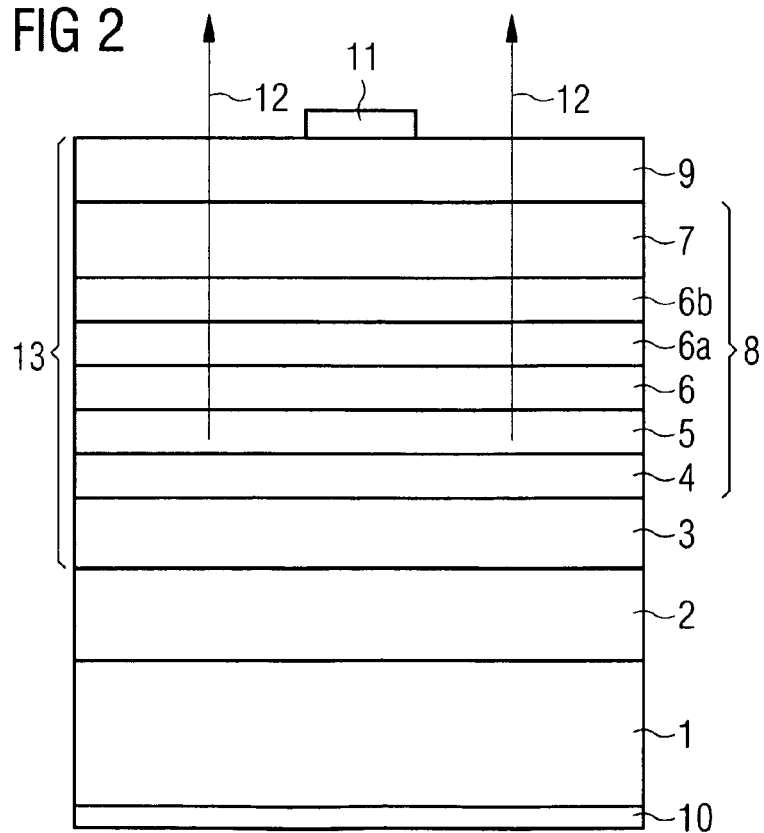
FIG. 2 shows a schematic illustration of a cross section through a radiation-emitting optoelectronic semiconductor chip in accordance with a further exemplary embodiment of the invention.

The second exemplary embodiment of a radiation-emitting optoelectronic semiconductor chip according to the invention as illustrated schematically in cross section in FIG. 2 differs from the first exemplary embodiment by virtue of the fact that the second undoped layer 6 is succeeded, as seen from the active layer, by two further undoped layers 6a, 6b each having a lower aluminum proportion than the preceding layer. The undoped layer 6a succeeding the second undoped layer 6 thus has a lower aluminum proportion than the second undoped layer 6 preceeding it. The further undoped layer 6b succeeding the undoped layer 6a has a lower aluminum proportion than the undoped layer 6a preceeding it.

In this embodiment of the invention, a plurality of interfaces at which the aluminum proportion rises as seen from the p-doped layer 9 are contained between the p-doped layer and the active layer 3. The diffusion-inhibiting effect is advantageously intensified in this way. By way of example, in the exemplary embodiment illustrated in FIG. 2, the interface between the layers 6b and 6a, the interface between the layers 6a and 6 and the interface between the layers 6 and 5 in each case act as a diffusion barrier for a p-type dopant that diffuses from the p-doped layer 9 in the direction toward the active layer 3.

As an alternative, the second undoped layer 6 may also be followed, as seen from the active layer, by a layer sequence alternately having a higher and lower aluminum content. In this case, by way of example, the undoped layer 6a succeeding the second undoped layer 6 has a larger aluminum proportion than the second undoped layer 6 preceeding it. The further undoped layer 6b succeeding the undoped layer 6a has a lower aluminum proportion than the undoped layer 6a preceeding it. In this case, a p-type dopant diffusing from the p-doped layer 9 in the direction toward the active layer 3 would have to traverse two interfaces between undoped layers at which the aluminum content increases.

The second exemplary embodiment otherwise corresponds to the first exemplary embodiment described above. In particular, the advantageous conFigurations of the invention described in connection with the first exemplary embodiment likewise apply to the second exemplary embodiment.

Figure 3:
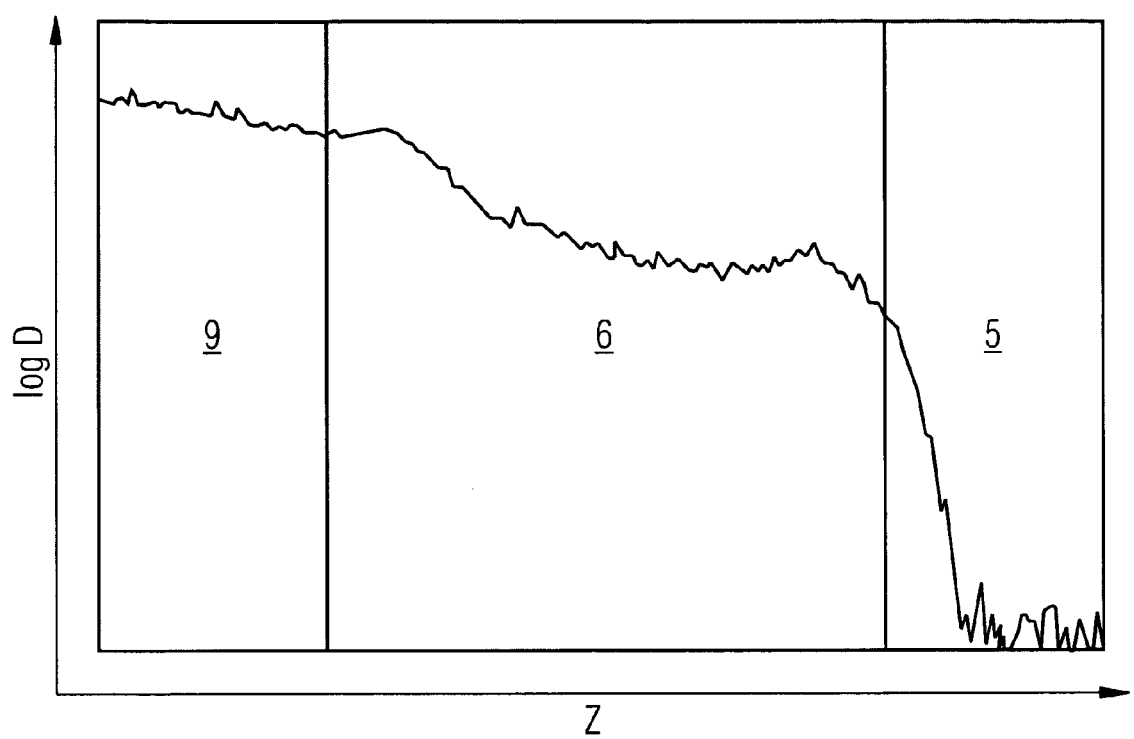
FIG. 3 shows a schematic graphical illustration of the dopant concentration D in logarithm representation as a function of a spatial coordinate z in a further exemplary embodiment of the invention.

In FIG. 3, the concentration D of the dopant magnesium in a further exemplary embodiment of the invention in logarithmic representation is plotted as a function of a spatial coordinate z running from a p-doped layer 9 in the direction toward two undoped layers 5, 6. In this exemplary embodiment, the first undoped layer 5 is an $Al_{0.5}In_{0.5}P$ layer. A second undoped layer 6 made of $Al_{0.25}Ga_{0.25}In_{0.5}P$ adjoins the first undoped layer 5. A layer 9 made of $Al_{0.5}In_{0.5}P$ and p-doped with magnesium adjoins the second undoped layer 6.

While the concentration D of the dopant magnesium, as a consequence of diffusion, is only slightly lower in the second undoped layer 6 than in the p-doped layer 9, the dopant concentration in the first undoped layer 5 decreases significantly with increasing distance from the interface to the second undoped layer 6. The first undoped layer 5, having a larger aluminum proportion than the second undoped layer 6, thus acts as a diffusion barrier for the dopant magnesium.

The invention is not restricted by the description on the basis of the exemplary embodiments. Rather, the invention encompasses any new feature and also any combination of features, which in particular comprises any combination of features in the patent claims, even if this feature or this combination is itself not explicitly specified in the patent claims or exemplary embodiments.

I claim:

1. A radiation-emitting optoelectronic semiconductor chip comprising:
   an active layer;
   at least one p-doped layer; and
   a layer sequence arranged between the active layer and the p-doped layer and comprising at least a first undoped layer and a second undoped layer, the second undoped layer adjoining the first undoped layer and succeeding the first undoped layer as seen from the active layer,
   wherein
   the first undoped layer and the second undoped layer contain aluminum, the first undoped layer having an aluminum proportion y1 and the second undoped layer having an aluminum proportion y2 and the aluminum proportion y1 in the first undoped layer being greater than the aluminum proportion y2 in the second undoped layer.

2. The radiation-emitting optoelectronic semiconductor chip as claimed in claim 1, wherein the first undoped layer comprises $In_{x1}Al_{y1}Ga_{1-x1-y1}P$ where $0 \leq x1 \leq 1, 0<y1 \leq 1$, and the second undoped layer comprises $In_{x2}Al_{y2}Ga_{1-x2-y2}P$ where $0 \leq x2 \leq 1, 0<y2 \leq 1$ and $x2+y2 \leq 1$.

3. The radiation-emitting optoelectronic semiconductor chip as claimed in claim 2, wherein for the aluminum proportion y1 of the first undoped layer, $y1 \leq 0.2$ 4. The radiation-emitting optoelectronic semiconductor chip as claimed in claim 2, wherein for the gallium proportion 1-x1-y1 of the first undoped layer, $-x1-y1 \leq 0.3$.

5. The radiation-emitting optoelectronic semiconductor chip as claimed in claim 4, wherein the first undoped layer contains no gallium.

6. The radiation-emitting optoelectronic semiconductor chip as claimed in claim 2, wherein for the aluminum proportion y2 of the second undoped layer, $y2 \leq 0.4$.

7. The radiation-emitting optoelectronic semiconductor chip as claimed in claim 2, wherein for the gallium proportion 1-x2-y2 second undoped layer, $1-x2-y2 \geq 0.1$.

8. The radiation-emitting optoelectronic semiconductor chip as claimed in claim 1, wherein the first undoped layer has $In_{x1}Al_{y1}Ga_{1-x1-y1}N$, where $0 \leq x1 \leq 1, 0<y1 \leq 1$ and $x1+y1 \leq 1$, and the second undoped layer has $In_{x2}Al_{y2}Ga_{1-x2-y2}N$, where $0 \leq x2 \leq 1, 0<y2 \leq 1$ and $x2+y2 \leq 1$.

9. The radiation-emitting optoelectronic semiconductor chip as claimed in claim 8, wherein for the aluminum proportion y1 of the first undoped layer, $y1 \leq 0.1$.

10. The radiation-emitting optoelectromic semiconductor chip as claimed in claim 8, wherein for the gallium proportion 1-x1-y1 of the first undoped layer, $1-x1-y1 \leq 0.9$.

11. The radiation-emitting optoelectronic semiconductor chip as claimed in claim 10, wherein the first undoped layer contains no gallium.

12. The radiation-emitting optoelectronic semiconductor chip as claimed in claim 8, wherein for the aluminum proportion y2 of the second undoped layer, $y2<0.3$ 13. The radiation-emitting optoelectronic semiconductor chip as claimed in claim 8, wherein for the gallium proportion 1-x2-y2 of the second undoped layer, $1-x2-y2 \geq 0.7$.

14. The radiation-emitting optoelectronic semiconductor chip as claimed in claim 2, wherein the first undoped layer has an indium proportion x1>0 and the second undoped layer has an indium proportion x2>0.

15. The radiation-emitting optoelectronic semiconductor chip as claimed in claim 1, wherein the active layer comprises $In_{x3}Al_{y3}Ga_{1-x3-y3}P$ or $In_{x3}Al_{y3}Ga_{1-x3-y3}N$, where $0 \leq x3 \leq 1$, $0 \leq y3 \leq 1$ and $x3+y3 \leq 1$.

16. The radiation-emitting optoelectronic semiconductor chip as claimed in claim 1, wherein the p-doped layer contains Mg or Zn as dopant.

17. The radiation-emitting optoelectronic semiconductor chip as claimed in claim 1, wherein the first undoped layer has a thickness of from 10 nm to 1000 nm inclusive.

18. The radiation-emitting optoelectronic semiconductor chip as claimed in claim 1, wherein a total thickness of the layer sequence is between 50 nm and 1 μm inclusive.

19. The radiation-emitting optoelectronic semiconductor chip as claimed in claim 1, wherein the second undoped layer is succeeded, as seen from the active layer, by at least one further undoped layer having a smaller aluminum proportion than the layer preceding it.

20. The radiation-emitting optoelectronic semiconductor chip as claimed in claim 1, wherein the semiconductor chip comprises an epitaxial layer sequence fabricated by means of MOVPE.

21. The radiation-emitting optoelectronic semiconductor chip as claimed in claim 14, wherein x1=x2.

* * * * *

UNITED STATES PATENT AND TRADEMARK OFFICE
CERTIFICATE OF CORRECTION

| | | |
|---|---|---|
| PATENT NO. | : 7,470,934 B2 | Page 1 of 1 |
| APPLICATION NO. | : 11/477408 | |
| DATED | : December 30, 2008 | |
| INVENTOR(S) | : Norbert Linder | |

It is certified that error appears in the above-identified patent and that said Letters Patent is hereby corrected as shown below:

In the Claims

Column 7, lines 38-40, correct claim 4 as follows:

-- 4. The radiation-emitting optoelectronic semiconductor chip as claimed in claim 2, wherein for the gallium proportion 1-x1-y1 of the first undoped layer, ~~x1-y1 ≤0.3~~ 1-x1-y1 ≤ 0.3. --.

Column 8, lines 9-11, correct claim 10 as follows:

-- 10. The radiation-emitting ~~optoeleotromic~~ optoelectronic semiconductor chip as claimed in claim 8, wherein for the gallium proportion 1-x1-y1 of the first undoped layer, 1-x1-y1 ≤ 0.9. --.

Signed and Sealed this
Thirtieth Day of July, 2013

Teresa Stanek Rea
*Acting Director of the United States Patent and Trademark Office*